United States Patent [19]

Oldham

[11] Patent Number: 5,280,449
[45] Date of Patent: Jan. 18, 1994

[54] DATA MEMORY AND METHOD OF READING A DATA MEMORY

[75] Inventor: Harry E. Oldham, Swavesey, Great Britain

[73] Assignee: Advanced RISC Machines Limited, Cambridge, Great Britain

[21] Appl. No.: 959,712

[22] Filed: Oct. 13, 1992

[51] Int. Cl.$^5$ ............................................. G11C 7/00
[52] U.S. Cl. ...................... 365/189.02; 365/189.07; 365/203; 365/207; 365/230.02
[58] Field of Search ............... 365/189.02, 203, 227, 365/230.02, 189.07, 49, 207

[56] References Cited

U.S. PATENT DOCUMENTS

| | | | |
|---|---|---|---|
| 4,870,622 | 9/1989 | Aria et al. | 365/230.02 |
| 4,882,709 | 11/1989 | Wyland | 365/230.02 X |
| 4,975,877 | 12/1990 | Bell | 365/230.02 X |
| 5,091,851 | 2/1992 | Shelton et al. | 365/189.02 X |
| 5,093,805 | 3/1992 | Singh | 365/189.02 X |

Primary Examiner—Eugene R. LaRoche
Assistant Examiner—Do Hyun Yoo
Attorney, Agent, or Firm—Woodcock Washburn Kurtz Mackiewicz & Norris

[57] ABSTRACT

A data memory and a method of reading a data memory are described. Data words (Word0, Word1, Word2, Word3) are stored within the data memory within an array of memory cells arranged in columns and rows. A particular data word within a memory cell is accessed by activating a complete row (2) to output the data words within all columns of that row and then selecting the data word from the appropriate column with a data word selection multiplexer (6). An amplifier (8) is used to reduce the time taken for data signals read from the array to reach readable values. In order to save power, the amplifier is disabled during a second and subsequent successive reading operations from a row that has already been activated. Precharging of a output lines is also disabled for second and subsequent successive readings from a row.

9 Claims, 2 Drawing Sheets

DATA MEMORY AND METHOD OF READING A DATA MEMORY

BACKGROUND OF THE INVENTION

1. Field of the Invention

This invention relates to data memories. More particularly this invention relates to data memories in which data words are stored within an array of memory cells arranged in columns and rows.

2. Description of the Prior Art

It is known to provide data memories, such as cache memories, in which data words are stored within memory cells arranged in an array of columns and rows (a memory cell stores the one or more bits that together comprise a data word, e.g. for 32 bit data words the memory cells would each store 32 bits of data). In order to read data from a particular memory cell, an entire row of memory cells is activated so as to place data signals representing the content of all of the memory cells comprising that row onto output lines for each column. A particular data word from within one memory cell is then selected from amongst those output by the entire row.

A desirable feature of memory is that the read access time should be low. A problem in this regard is that it takes a finite time between selecting a row of memory cells so as to place its data signals onto the output lines and the time at which the voltages on the output lines reach readable values. This time is limited by the finite resistance and capacitance of the elements involved. One way of dealing with this problem has been to use amplifiers on the output lines to provide full rail voltage readable values at the amplifier output before the voltage levels on the signal lines from the memory array have in fact reached such levels.

Whilst the use of such amplifiers is successful in reducing memory access times, it introduces a problem of increasing the power consumption of the data memory. Amplifiers typically consume relatively large amounts of power relative to the other circuit elements in the data memory. In the context of an increasing need to reduce power consumption (e.g. to assist in the production of portable battery powered equipment), the power consumption of such amplifiers becomes a problem.

SUMMARY OF THE INVENTION

It is an object of this invention to reduce the above problems and provide a data memory having a lower power consumption.

Viewed from one aspect this invention provides a data memory for storing a plurality of data words, said data memory comprising:

(i) an array of memory cells having a plurality of columns of memory cells and a plurality of rows of memory cells, each of said memory cells being operable to store a data word;

(ii) a plurality of column data word output paths each associated with one of said columns of memory cells;

(iii) means for coupling those data signals representing data words stored within a selected row to said column data word output paths;

(iv) a data word selection multiplexer for selecting data signals representing a selected data word on one of said column data word output paths as a selected data word for output from said data memory;

(v) an amplifier for amplifying data signals of at least said selected data word so as more rapidly to reach readable values;

(vi) means for detecting if successive data words to be read from said data memory are stored in one row of memory cells; and (vii) means, responsive to said means for detecting, for disabling operation of said amplifier and selecting an alternative path for reading data words from said data memory for a second and subsequent successive reading operations from said one row of memory cells.

The invention both recognises and exploits that a large number of read operations from a data memory in practice involve reading successive data words from the same row of the memory. In this case, the amplifier need only be used for the first data word to be read from a particular row and can then be disabled, thereby saving power, for subsequent successive read operations from that row. In the case of rows of four memory cells which are being successively read, the amplifier need only be used for one in every four of the read operations thereby saving approximately 75% of the power that would otherwise be consumed by the amplifier.

Another power saving feature of preferred embodiments of the invention relates to improved control of a precharge operation and provides a precharge circuit for precharging said column data word output paths; and means responsive to said means for detecting for disabling operation of said precharge circuit for a second and subsequent successive reading operations from said one row of memory cells.

This preferred feature is analogous to disabling the amplifier for a second and subsequent successive readings from a given row of memory cells as the same should be done for a precharge circuit that is used for precharging the column data word output paths to reduce read access times. As above, in the case of successive read operations from rows of memory cells containing four memory cells, the precharge circuit should only be used for one read operation in every four.

It will be appreciated that the column data word output paths could take various forms. In particular, the paths will have a number of distinct signal lines for each of the bits of a data word. However, in preferred embodiments said column data word output paths have two complementary signal lines for each bit of said data word and said amplifier is a differential amplifier.

The use of a differential amplifier with complementary signal lines for each bit improves the noise immunity of the read operation and allows a higher gain amplifier to be used leading to a reduction in read access times.

The amplifier could be used to amplify all the data signals from the entire selected row of memory cells. However, in preferred embodiments said amplifier is connected downstream of said data word selection multiplexer.

Connecting the amplifier downstream of the data word selection multiplexer means that fewer data signals in fact need to be amplified thereby reducing the power consumption of the amplification process.

The means for disabling the amplifier can take many forms in dependence upon the form of the amplifier amongst other things. However, in an advantageously simple and effective embodiment of the invention said means for disabling comprises a bypass multiplexer for selecting for output from said data memory one of data signals downstream of said amplifier and data signals upstream of said amplifier and means for interrupting a power supply to said amplifier.

A preferred direct way of identifying each data word is that each data word has an associated memory address, a higher bit order portion of said memory address identifying a row of memory cells in which said data word is stored and a lower bit order portion identifying a particular data word within said row and controlling said data word selection multiplexer.

It will be appreciated that the data memory of the invention could take many forms, such as RAM, ROM, PROM etc. However, the balance between providing a low read access time while not incurring too high a power consumption is particularly stringent in the field of cache data memories. In preferred embodiments of the invention the data memory is cache data memory and comprises means for comparing said higher bit order portion of a data word to be read with higher bit order portions of data words stored within rows of memory cells to detect if said data word to be read is present in said cache data memory.

It will be appreciated by those in the art that the means for detecting could take a number of different forms. However, an advantageously efficient embodiment of the means for detecting is one in which said means for detecting detects whether said higher bit order portion of successive data words to be read are identical indicating that said successive data words are stored in said one row of memory cells.

Viewed from another aspect this invention provides a method of reading data words from a data memory comprising: an array of memory cells having a plurality of columns of memory cells and a plurality of rows of memory cells, each of said memory cells being operable to store a data word; a plurality of column data word output paths each associated with one of said columns of memory cells; said method comprising the steps of:

(i) coupling those data signals representing data words stored within a selected row to said column data word output paths;

(ii) selecting data signals representing a selected data word on one of said column data word output paths as a selected data word for output from said data memory;

(iii) amplifying data signals of at least said selected data word so as more rapidly to reach readable values;

(iv) detecting if successive data words to be read from said data memory are stored in one row of memory cells; and (v) disabling operation of said amplifier and selecting an alternative path for reading data words from said data memory for a second and subsequent successive reading operations from said one row of memory cells, in response to said detection.

The above, and other objects, features and advantages of this invention will be apparent from the following detailed description of an illustrative embodiment which is to be read in connection with the accompanying drawings.

DESCRIPTION OF THE PREFERRED EMBODIMENT

Figure 1:
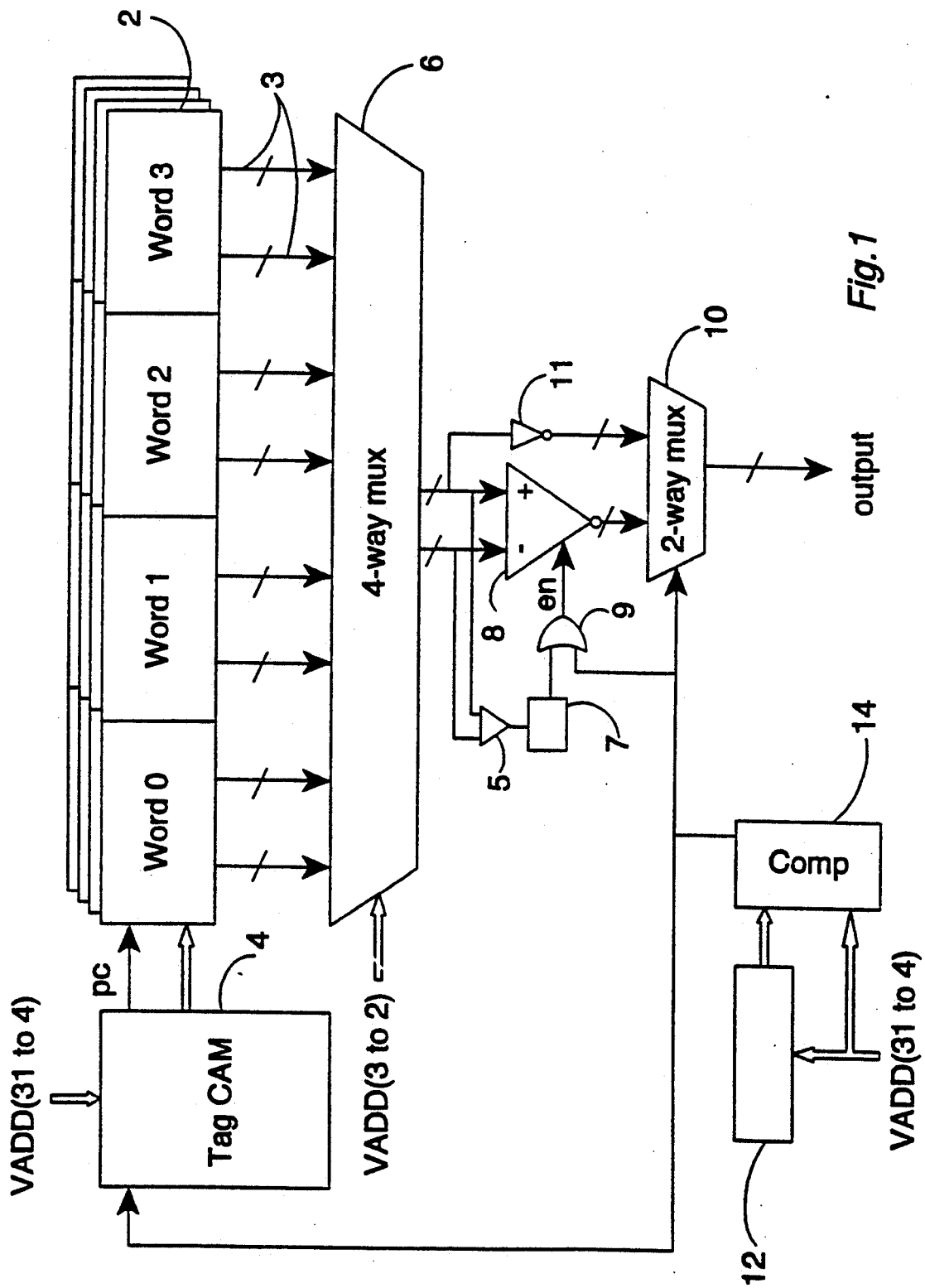
FIG. 1 is a schematic diagram illustrating a part of a data memory in accordance with one embodiment of the invention.

FIG. 1 illustrates a part of a high speed cache memory. One row 2 of memory cells is illustrated. In practice there is a two-dimensional array of data elements arranged in columns and rows. Each of the memory cells contains a data word (Word 0, Word 1, Word 2, Word 3). Each of the memory cells is connected to a column data word output path 3 comprising two complementary signal lines for each bit of the data word. The column data word output paths 3 are input to a 4-way multiplexer 6 that serves as a data word selection multiplexer.

In use, the uppermost 28 bits of the virtual address (VADD(31 to 4)) of the data to be recovered are compared to the addresses of the data already stored in the cache by a Tag CAM unit 4. If a cache "hit" is registered then the bits 3 and 2 of the virtual address (VADD(3 to 2)) are used to identify which word of data within the row 2 is required to be switched by the 4-way multiplexer 6 to the output.

Whichever of the column data word output paths 3 is selected by the four way multiplexer 6 is supplied to a differential sense amplifier 8. A 2-way multiplexer 10 serving as a bypass multiplexer is arranged to receive both the output of the sense amplifier 8 and a signal that has by-passed the sense amplifier 8 and passed through an invertor 11 that serves as a buffer (isolates the memory cell to make the read non-destructive). If the sense amplifier 8 is disabled then the 2-way multiplexer 10 selects the by-passed input.

The function of the sense amplifier is to speed cache access by amplifying the data signals comprising the data words that are selected by the 4-way multiplexer 6. The sense amplifier 8 produces a full zero or one value more rapidly than would be the case if the output lines of the cache were allowed to settle unassisted to their logical values (finite RC type response). Whilst providing more rapid cache access, the sense amplifier 8 has the disadvantage of consuming a comparatively large amount of electrical power.

A means for detecting successive access attempts to the same row of data elements 2 may be formed of an address store 12 and a comparator 14. The uppermost 28 bits of the virtual address (VADD(31 to 4)) of the current and the previous read attempts are stored within the address store 12 and compared to the current address with a comparator 14. If the contents of the delay unit 12 are the same, then it is the same row of data elements 2 that is being accessed in the current attempt as in the previous attempt. In this case, the sense amplifier 8 is disabled (i.e. put into a low power consumption state) and the 2-way multiplexer 10 is switched to select the by-passed signal by an enable signal "en". As an alternative, the enable signal "en" may be provided by a state machine that controls the overall operation of the processing apparatus of which the cache memory forms part.

The sense amplifier is disabled by gating a transistor that supplies power to the sense amplifier 8. As well as being arranged to be disabled by the enable signal "en", a one bit low power amplifier 5 is provided that detects when the complementary signals forming one bit of the output from the data word selection multiplexer 6 have diverged and passes a signal, that acts in the same way as the enable signal "en", via a delay line 7 and an OR-gate 9 to the sense amplifier 8. The enable signal "en" is fed to another input to the OR-gate 9.

The function of the one bit amplifier 5 and delay line 7 is to disable the sense amplifier 8 after a fixed time from when the last read operation takes place. This feature removes power to the sense amplifier 8 in circumstances such as if the system enters a sleep state such as by stopping the clock signals controlling the operation.

The enable signal "en" is also supplied to the Tag CAM unit 4 where it serves to disable the precharge function effected via a precharge signal pc supplied to the column data word output paths 3. The column data data word output path signal lines are charged to a high voltage by the precharge function and then selectively discharged as the data words are palced onto them.

Figure 2:
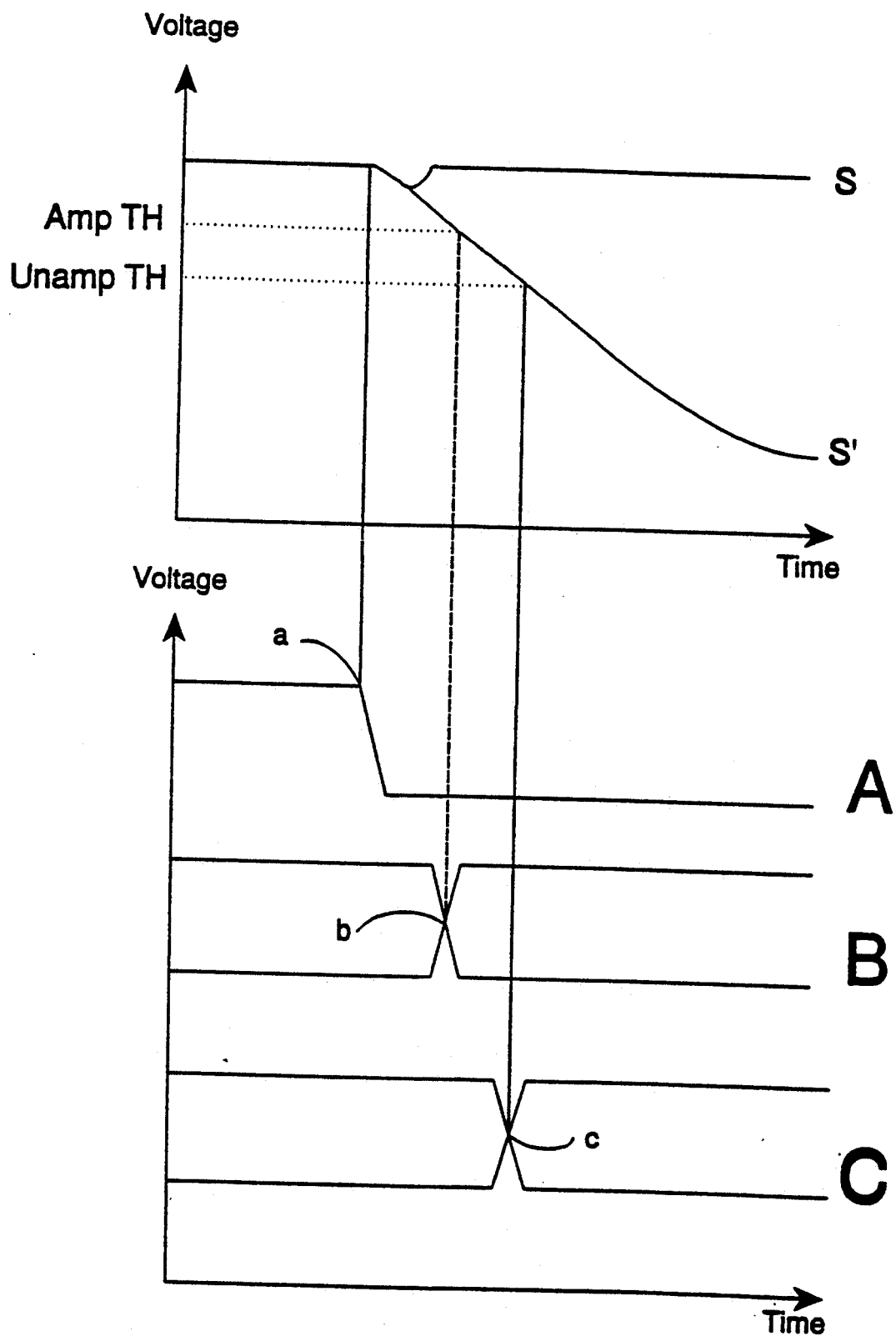
FIG. 2 shows signal levels illustrating the operation of the data memory of FIG. 1.

FIG. 2 illustrates the operation of the sense amplifier 8. The upper diagram shows the non-inverted S and inverted S' signals for a given bit. In order to be readable outside of the memory, these signals must exceed certain threshold conditions. These threshold conditions differ depending upon whether the signal is or is not amplified by the amplifier 8. Initially both the inverted and non-inverted signals are the same and have a high voltage value. When a bit of information is switched onto the signal lines then the voltage values diverge. The speed at which the voltage values diverge is limited by the finite resistances and capacitances involved in the circuit path to the output.

The lines shown illustrate the unamplified movement of these voltages to their resting values. The differing threshold values at which the signals become readable in dependence upon whether the signals are amplified (Amp TH) or unamplified (Unamp TH) are also shown.

The lower part of FIG. 2 illustrates the times at which various events occur within the circuit. The line A illustrates the switching onto the column data word output paths 3 of the data signals by the row 2 of memory cells; this occurs at time a. Line B the time at which the amplified voltage levels meet the amplified threshold level (Amp TH) and so become externally readable; this occurs at time b. Line C illustrates the time at which the unamplified voltage levels meet the unamplified threshold level (Unamp TH); this occurs at time c. The delay between time a and time b is smaller than the delay between time a and time c showing the reduction in access time that is achieved by using the sense amplifier 8.

Returning to consider the upper part of FIG. 2, the divergence of the voltage levels to reach their steady state values occurs across the entire row 2 of memory cells. Thus, whilst in the first read operation there is a delay waiting for the signal levels to reach their stable levels (this delay being reduced by the sense amplifier 8), there is no such delay associated with subsequent successive reading operations from the same row 2 of memory cells. Thus, for times beyond time c, when successively reading data words from within the same row 2 of memory cells, the sense amplifier 8 is disabled and the precharge operation of the Tag CAM unit 4 is disabled.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A data memory for storing a plurality of data words, said data memory comprising:
   (i) an array of memory cells having a plurality of columns of memory cells and a plurality of rows of memory cells, each of said memory cells being operable to store a data word;
   (ii) a plurality of column data word output paths each associated with one of said columns of memory cells;
   (iii) means for coupling data signals representing data words stored within a selected row to said column data word output paths;
   (iv) a data word selection multiplexer for selecting data signals representing a selected data word on one of said column data word output paths as a selected data word for output from said data memory;
   (v) an amplifier for amplifying data signals of at least said selected data word so as more rapidly to reach readable values;
   (vi) means for detecting if successive data words to be read from said data memory are stored in one row of memory cells; and
   (vii) means, responsive to said means for detecting, for disabling operation of said amplifier and selecting an alternative path for reading data words from said data memory for a second and subsequent successive reading operations from said one row of memory cells.

2. A data memory as claimed in claim 1, comprising:
   a precharge circuit for precharging said column data word output paths; and
   means responsive to said means for detecting for disabling operation of said precharge circuit for a second and subsequent successive reading operations from said one row of memory cells.

3. A data memory as claimed in claim 1, wherein each of said column data word output paths has two complementary signal lines for each bit of said data word and said amplifier is a differential amplifier.

4. A data memory as claimed in claim 1, wherein said amplifier is connected downstream of said data word selection multiplexer.

5. A data memory as claimed in claim 1, wherein said means for disabling and selecting comprises a bypass multiplexer for selecting for output from said data memory one of data signals downstream of said amplifier and data signals upstream of said amplifier and means for interrupting a power supply to said amplifier.

6. A data memory as claimed in claim 1, wherein each data word has an associated memory address, a higher bit order portion of said memory address identifying a row of memory cells in which said data word is stored and a lower bit order portion identifying a particular data word within said row and controlling said data word selection multiplexer.

7. A data memory as claimed in claim 6, wherein said data memory is a cache data memory and comprising means for comparing said higher bit order portion of a data word to be read with higher bit order portions of data words stored within rows of memory cells to detect if said data word to be read is present in said cache data memory.

8. A data memory as claimed in claim 6, wherein said means for detecting detects whether said higher bit order portion of successive data words to be read are identical indicating that said successive data words are stored in said one row of memory cells.

9. A method of reading data words from a data memory comprising: an array of memory cells having a plurality of columns of memory cells and a plurality of rows of memory cells, each of said memory cells being operable to store a data word; a plurality of column data word output paths each associated with one of said columns of memory cells; said method comprising the steps of:
 (i) coupling data signals representing data words stored within a selected row to said column data word output paths;
 (ii) selecting data signals representing a selected data word on one of said column data word output paths as a selected data word for output from said data memory;
 (iii) amplifying data signals of at least said selected data word so as more rapidly to reach readable values;
 (iv) detecting if successive data words to be read from said data memory are stored in one row of memory cells; and
 (v) disabling operation of an amplifier for said amplifying step and selecting an alternative path for reading data words from said data memory for a second and subsequent successive reading operations from said one row of memory cells, in response to said detection.

* * * * *